United States Patent [19]
Scifres et al.

[11] 4,063,189
[45] Dec. 13, 1977

[54] LEAKY WAVE DIODE LASER

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 674,692

[22] Filed: Apr. 8, 1976

[51] Int. Cl.² .............................................. H01S 3/19
[52] U.S. Cl. ................................. 331/94.5 H; 357/18
[58] Field of Search ................. 331/94.5 H, 94.5 PE; 357/18

[56] References Cited
U.S. PATENT DOCUMENTS

3,806,830  4/1974  Yonezu .......................... 331/94.5 H
3,943,462  3/1976  Thompson ...................... 331/94.5 H Primary Examiner—Stanley D. Miller, Jr.
Assistant Examiner—James W. Davie
Attorney, Agent, or Firm—M. J. Colitz; T. J. Anderson; L. Zalman

[57] ABSTRACT

A heterojunction diode laser which utilizes leaky wave coupling through a thin confining layer or a pair of thin confining layers to produce a high powered, highly collimated output beam with high external differential quantum efficiency, and relative freedom from facet damage resulting from high optical density.

9 Claims, 15 Drawing Figures

LEAKY WAVE OUTPUT

FIG. 12B

2 μm WIDE FILAMENT

FIG. 13

LEAKY WAVE DIODE LASER

BACKGROUND OF THE INVENTION

In recent years, much research has been carried on in the area of diode lasers. Among the advantages of diode lasers are their small size, potentially low cost, low power requirements and capability of being modulated at very high data rates. In addition, diode lasers are extremely rugged devices since they do not use a glass gas discharge tube or external mirrors subject to misalignment. Furthermore, the power to light conversion efficiency of diode lasers is the highest of any laser operating at room temperature.

To meet the requirements for usage in a variety of applications, diode lasers must be provided which have device characteristics such as: very low output beam divergence, lowest order transverse mode operation at high pumping current levels, high peak pulsed output power, high differential quantum efficiency, and relative freedom from facet degradation usually resulting from high power densities.

OBJECTS OF THE INVENTION

It is an object of the present invention to provide an improved diode laser.

It is a further object of the present invention to provide a diode laser having low output beam divergence.

It is a further object of the present invention to provide a diode laser capable of operating in the lowest order transverse mode.

It is a still further object of the present invention to provide a diode laser having high peak pulsed output power.

It is a still further object of the present invention to provide a diode laser having high differential power efficiency.

It is a still furthr object of the present invention to provide a diode laser having low facet degradation.

SUMMARY OF THE INVENTION

In accordance with the invention the foregoing objects are achieved by a heterojunction diode laser which utilizes leaky wave coupling. Leaky wave operation is provided by making the light confining layer between the laser active region and in one instance the laser substrate very thin and choosing the composition of the substrate such that power absorption at the lasing wavelength is low. Due to the thinness of the confining layer, the leaky wave output is emitted into the laser substrate at an angle to the rectifying junction of the laser. This leaky radiation, after experiencing some absorption in the substrate, illuminates the cleaved face of the substrate (facet) to provide the laser output.

Since the leaky wave output beam is emitted over a very large area of the cleaved face (facet) of the substrate, the output beam collimation is excellent, that is, the output beam divergence is very small. Further, the leaky wave laser functions in the lowest order transverse mode because higher order transverse modes lose much more power to the leaky wave than does the lowest order transverse mode and therefore the higher order transverse modes have substantially higher thresholds. In addition, the leaky wave laser has high power output because power is extracted over the entire length of the laser substrate surface, and facet damage is minimized since the power is spread out over a very large area of the substrate surface. Also, differential quantum efficiency is high because the substrate doping and composition are chosen such that the leaky wave experiences a minimal amount of absorption in the substrate. Thus, the leaky wave heterojunction diode laser has many of the device characteristics required for a variety of practical applications.

BRIEF DESCRIPTION OF THE DRAWINGS

FIG. 4 depicts the far field scan of the laser of FIG. 1a.

DETAILED DESCRIPTION OF THE INVENTION

Figure 1:
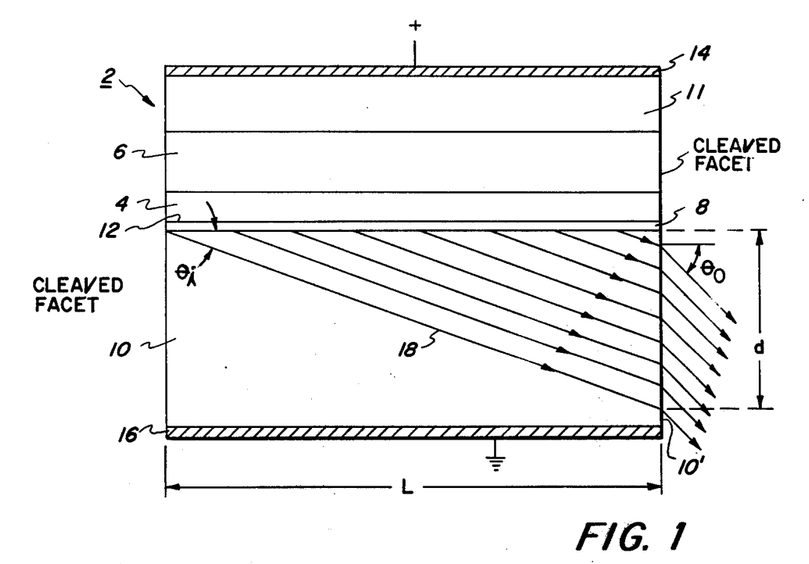
FIG. 1 is a side view of a leaky wave heterojunction diode laser in accordance with the invention.

Referring now to FIG. 1, there is shown a diode laser 2 in accordance with the invention with the laser 2 comprised of an active region layer 4, first and second radiation and carrier confining layers 6 and 8 bordering the layer 4, a substrate layer 10 and a super-substrate layer 11. The refractive index of the material of active region layer 4 is greater than the refractive indices of the material(s) of layers 6 and 8. The thickness of layer 10 is very large compared to the thicknesses of layers 4 and 8, and the index of refraction of layer 10 is greater than the index of refraction of the material of layer 8. The layers 4, 6 and 11 are doped p-type and the layers 8 and 10 are doped n-type such that a rectifying junction 12 is provided at the interface of layers 4 and 8, with a non-rectifying junction being provided at the interfaces of layers 4 and 6, layers 8 and 10 and layers 6 and 11. Alternatively, the layers 8 and 10 can be p-type and the layers 4, 6 and 11 can be n-type to provide a rectifying junction at 12, or the layers may be otherwise doped to provide the rectifying junction at the interface between layers 4 and 6 or elsewhere. Upon a forward bias condition, as shown in FIG. 1, with the potential applied to electrode 14 greater than the potential applied to electrode 16, carriers (electrons and holes) are injected into, and confined within, active region layer 4 to generate radiation upon carrier recombination.

In conventional dual heterojunction diode lasers, the active region layer is made thin, that is, between 0.1 and 0.5 microns, and the confining layers are made relatively thick, that is, greater than 1 micron, to prevent loss of power by leakage of radiation through the confining layers into the substrate which is generally very lossy at the wavelength at which the active region layer is emitting. Due to the relatively small thickness of the active region layer, beam divergence in prior art diode lasers in relatively large.

In the diode laser of the present invention, the active region layer 4 can be relatively thick compared to the thickness of confining layer 8, that is, active region layer 4 can be on the order of 0.1 to 2.0 microns thick and confining layer 8 is on the order of 0.5 to 0.06 microns thick. Because of the thinness of layer 8, total optical confinement is not provided by layer 8 and a portion of the radiation generated in active region layer 4 upon forward bias thereof is emitted through the layer 8 into the substrate 10 at a very shallow angle $\theta_i$ to the plane of junction 12. The portion of the radiation emitted through layer 8 (the leaky wave 18), after experiencing some absorption in the very thick (25-100 microns) substrate 10, illuminates the cleaved facet or face 10' of the substrate 10, with refraction of the leaky wave at the substrate-air interface increasing to $\theta_o$ the angle that the leaky wave 18 makes with the rectifying junction 12 when the leaky wave exists the substrate 10.

As noted, the materials of layers 6 and 8 have a lower refractive index than the material of active region layer 4, and the material of substrate layer 10 has a higher refractive index than the material of layer 8 so that the angle that the leaky wave 18 makes with the junction 12 is very shallow. The equivalent index of refraction seen by the guided wave in active region layer 4 and the refractive index of substrate 10 at the laser wavelength preferably are substantially equal with layer 10 having a slightly higher index. For example, the layers 4, 6, 8 and 10 can be comprised of the ternary compounds GaAlAs, with active region layer 4 and substrate 10 containing less aluminum than layers 6 and 8 to provide layer 4 and substrate 10 with a higher refractive index than layers 6 and 8. For example, active region layer 4 and substrate 10 can be $Ga_{1-z}Al_zAs$ ($z<0.3$), and layers 6 and 8 can be $Ga_{1-z}Al_zAs$ ($0.15<z<0.8$). If it is desired to have the laser operate in the near infrared, layer 4 and substrate 10 may contain very little aluminum or no aluminum at all. The refractive index of a layer of GaAs containing p-type dopents will be very slightly higher than a layer of GaAs containing n-type dopents, so that if layer 4 and substrate 10 are both GaAs, layer 4 would have the higher refractive index.

Figure 2:
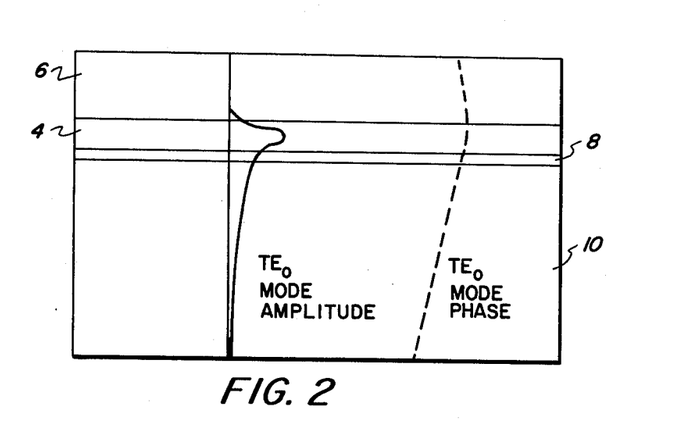
FIG. 2 depicts the amplitude and phase of the $TE_o$ mode propogating in the laser of FIG. 1.

When the heterojunction diode laser 2 is forward biased and the pumping current is above threshold requirements (on the order of 7 amperes, J = 6,000 A/cm², at 300° Kelvin), a TE mode pattern is set up in the laser 2 as shown by FIG. 2, with the mode propagating in the direction shown. The mode exponentially decays in layer 6 due to the low refractive index of that layer but, not withstanding the low refractive index and layer 8, decays only slightly in layer 8 because layer 8 is extremely thin. The mode, however, radiates into substrate 10 to produce the leaky wave 18. Radiation into substrate 10 occurs because the refractive index of substrate 10 is greater than the equivalent refractive index $n_{eq}$ of the laser 2 which, as is well known, takes into account the refractive indices of all of the materials making up the laser 2. Specifically, the equivalent refractive index $n_{eq} = \beta_z\lambda_o/2\pi$, where $\beta_z$ is the mode propogation constant of the laser.

Figure 3:
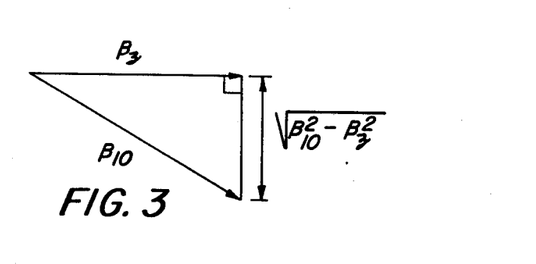
FIG. 3 is a vector diagram used to calculate the angle of the output of the laser of FIG. 1.

The leaky wave radiation 18 makes an angle of $\theta_i$ with the plane of the junction 12 and illuminates the facet 10' of layer 10 over a very large area and extend $d$ of which is approximated by $d = L\ tan\ (\theta_i)$ where L is the length of diode 2 as shown. The external angle $\theta_o$ of the radiation is given by $\sin\theta_o = n_{10}\sin\theta_i$, where $n_{10}$ is the index of refraction of the material of substrate 10. The angles $\theta_o$ and $\theta_i$ are determined by solving for the mode patterns and propagation constant $\beta_z$ using the equation $\beta_z = 2\pi n_{eq}/\lambda_o$ where $n_{eq}$ is as previously defined and $\lambda_o$ is the free space optical wavelength of the mode. The leaky wave propagates in substrate 10 and $\theta_i$ with a propagation constant $\beta_{10} = (2\pi n_{10})/\lambda_o$. As shown by the vector diagram of FIG. 3, $\beta_z = \beta_{10}\cos(\theta_i)$ where $\beta_{10}$ is the propagation constant of the radiation in substrate 10. Substituting for $\beta_z$ and $\beta_{10}$ yields $\sin\theta_i = (n_{10}^2 - n_{eq}^2)^{\frac{1}{2}}/n_{10}$ and $\sin\theta_0 = (n_{10}^2 - n_{eq}^2)^{\frac{1}{2}}$ which give the condition on $n_{10}$ for a particular angle $\theta_i$ and therefore provides for determination of $d$ using the previously mentioned relationship $d = L\ tan\ (\theta_i)$.

Since the leaky wave output beam is emitted over a large area $d$ of the substrate surface 10', collimation of beam 18 is excellent, that is, the output beam 18 divergence is very small. The laser 2 will function in the lowest order transverse mode ($TE_o$) because higher order modes lose more power to the leaky wave and therefore have substantially higher thresholds. The laser also has high output power because power is extracted along the entire length L of the laser. Differential efficiency of the laser is high because the output coupling is so large resulting from dual outputs; one from the normal emission from the active region as in a conventional double heterostructure laser and the second due to leaky wave emission. Facet damage is minimized because the output beam power is spread over a large area as indicated by $d$.

Figure 1A:
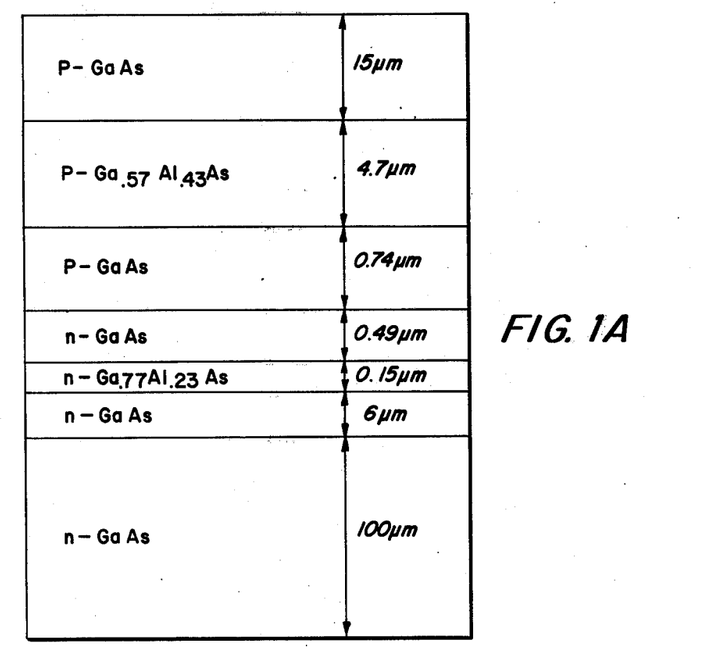
FIG. 1a is a side view of a leaky wave heterojunction diode laser in accordance with the invention with layer compositions and thicknesses shown.
Figure 4:
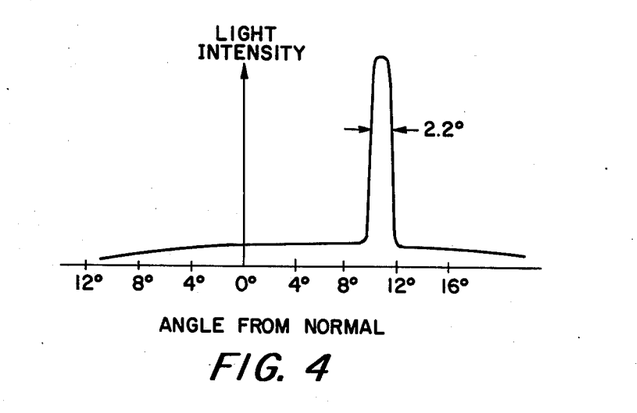

The heterojunction diode laser can be grown using conventional liquid phase epitaxy techniques well known to those skilled in the art; however, molecular beam epitaxy and vapor phase epitaxy could also be used. A specific laser produced by such growth and having the dimensions and compositions as shown in FIG. 1a is capable of providing an output beam with a two degree divergence perpendicular to the junction 12, is capable of operating in the lowest order $TE_o$ plus $TM_o$ modes at very high pumping levels, is capable of producing 3 watts peak output power at 300° Kelvin, and is capable of exhibiting a differential efficiency of 35–40%. For the laser of FIG. 1a, $\theta_i$ is approximately 3°, $\theta_o$ is approximately 10.5°, and L is approximately 400 um. The far-field scan of the laser of FIG. 1a is shown by FIG. 4. Threshold pumping levels of the laser of the subject invention are high (approximately double those of a similar conventional laser with confining layers of conventional thickness) because so much of the mode power is in the unpumped substrate. Of course, current thresholds can be reduced by using stripe geometries.

Figure 5:
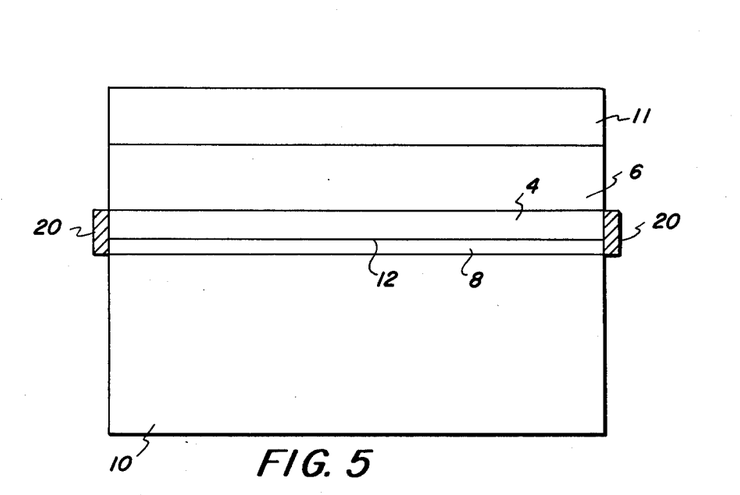
FIG. 5 is a side view of an alternate embodiment of a leaky wave heterojunction diode laser in accordance with the invention.

As shown by FIG. 5, the cleaved facets at the edges of the active region 4 of the laser of FIG. 1 can be provided with highly light reflective coatings 20 to decrease the transmitted power from the active region. Such coatings may be prepared by methods of shadow-masking, electroplating one side of the rectifying junction 12, or driving off from the edges of active layer 4 the binder in a gold plating solution with the heat from the active layer (the edges of substrate 10 would not be as warm as the edges of the layer 4 since power is more diffused there and the edges of the substrate are not heated sufficiently to drive off the binder).

Figure 6:
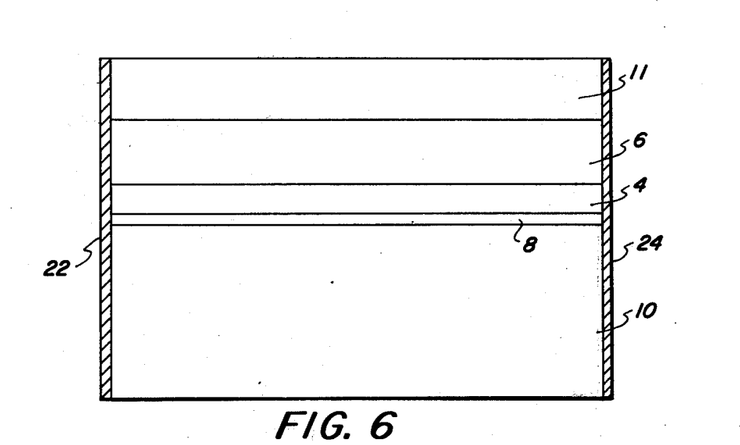
FIG. 6 is a side view of another alternate embodiment of a leaky wave heterojunction diode laser in accordance with the invention.
Figure 7:
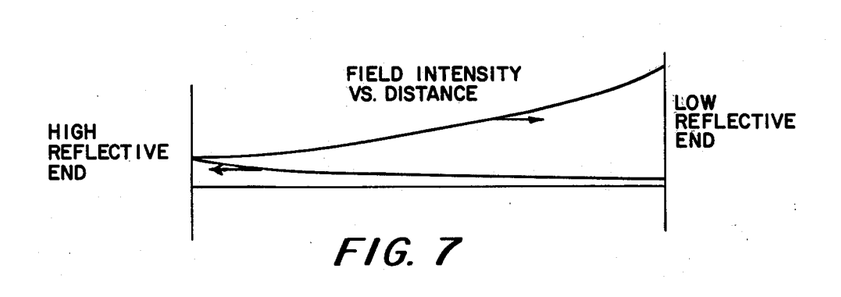
FIG. 7 depicts the field intensity of the laser mode provided by the laser of FIG. 6.

Another way of optimizing performance is to completely reflectively coat one facet of the laser of FIG. 1 as shown in FIG. 6 where coating 22 is highly light reflective. Coating 22 would cause the travelling wave propagating in the laser away from the reflecting facet to be larger than the wave travelling toward the reflecting facet and would therefore produce a much stronger leakage wave in one direction than the other. The other facet could have an anti-light reflection coating 24 thereon. FIG. 7 illustrates the field intensity vs. distance of the laser mode provided by the laser of FIG. 6. Anti-reflection coating 24 can provide a means for preferential reflection of the normal emission from active region layer 4 and preferential transmission of the leaky wave 18. This is achieved by fabricating coating 24 such that it has a thickness which is equal to $\lambda$ leaky wave/4 (or odd integer multiples thereof) where the leaky wave is emitted at the angle $\theta_i$. A coating of the thickness $\lambda$ leaky wave/4 would not be a quarter wavelength multiple of the normal emission from active region layer 4 since the normal emission is incident normal to the coating 24. The wave which experiences the $\lambda/4$ path length (leaky wave 18) experiences a lower reflection than does the wave (the normal emission wave) which does not see a $\lambda/4$ path length.

Figure 8:
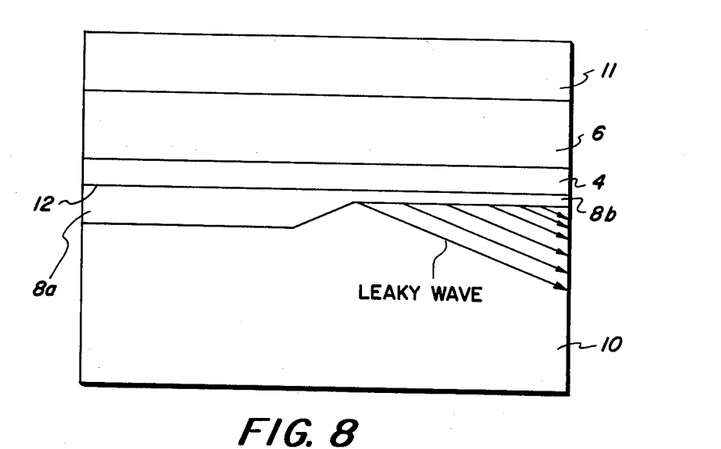
FIG. 8 depicts a side view of a further embodiment of a leaky wave laser in accordance with the invention.

Referring now to FIG. 8 there is shown a further modification of a leaky wave output laser. The layer 8 of the laser of FIG. 8 has a portion 8a which is of conventional thickness (greater than 1 micron) and has a very thin portion 8b (0.5 to 0.6 microns). The leaky wave output occurs only along thin porton 8b whereby device threshold is lowered and leaky wave attenuation by substrate 10 is lowered.

Figure 9:
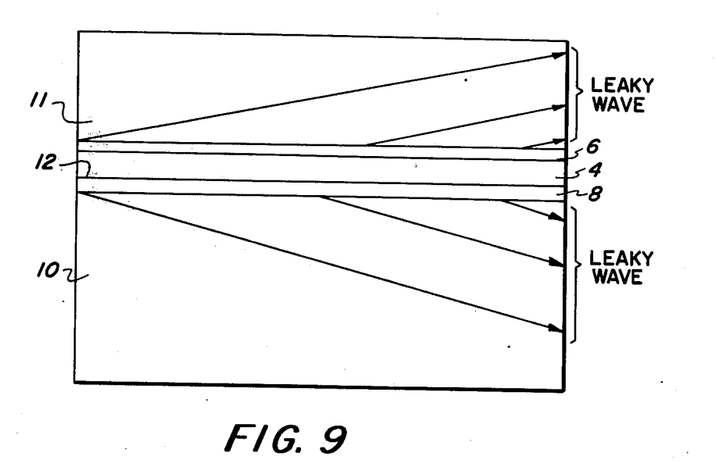
FIG. 9 depicts a side view of laser embodiment having two leaky wave outputs.

In the previously described lasers in accordance with the invention, only one confining layer is made very thin and leaky wave output is from only one side of the active region layer. FIG. 9 illustrates a laser in accordance with the invention where both confining layers 6 and 8 are made very thin (0.5 to 0.06 microns) and both layers 6 and 8 satisfy the relative refractive indicies requirement previously set forth, that is, the material of active region layer 4 and the material(s) of layers 10 and 11 have a higher refractive index than the material(s) of layers 6 and 8, with the equivalent index of refraction seen by the guided wave in active region layer 4 and the refractive index of layers 10 and 11 preferably being substantially equal but with the index of refraction of layers 10 and 11 being slightly higher than the equivalent refractive index. Since layer 10 may have a different refractive index than layer 11 due to being of different materials or due to doping, the two leaky waves may not be emitted at the same angle to the junction 12.

Figure 10:
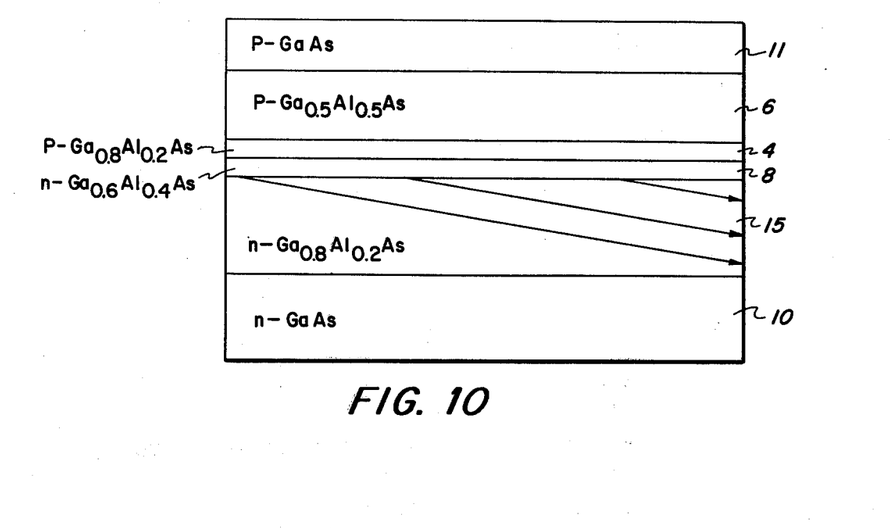
FIG. 10 depicts a side view of a leaky wave heterojunction diode laser with alternative compositions.
Figure 11:
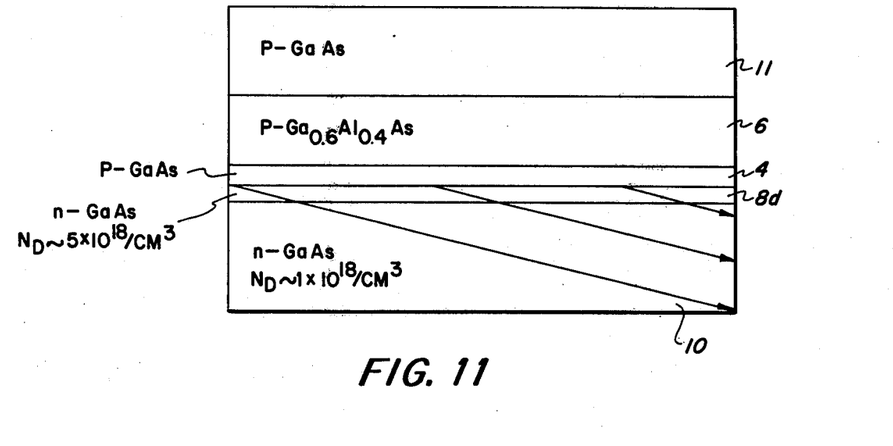
FIG. 11 depicts a side view of a leaky wave laser having leakage through a doped layer.

The active region layer of the lasers described hereinbefore has been of GaAs. The active region may be of other materials commonly used in semiconductor lasers and FIG. 10 depicts a laser in accordance with the invention wherein the active region 4, the confining layers 6 and 8 and super substrate layer 15 all are of GaAlAs with layers 4 and 15 having lower refractive indicies than layer 8 due to their containing less aluminum. The laser of FIG. 10 may be composed of numerous compositions of materials so long as the active region is bounded by at least one thin confining layer and the refractive indicies obey the proper relationships previously set forth. GaAlAsP is one example of a suitable material composition with others being compositions formed of commonly used solid state laser materials such as, for example, Ga, Al, As, P, In, Sb, Pb, Sn and Te. As shown by FIG. 11, a confining layer can be provided by heavily doping a portion of the substrate with heavily doped substrate portion 8d providing a thin confining layer with proper refractive index relationship.

Figure 12A:
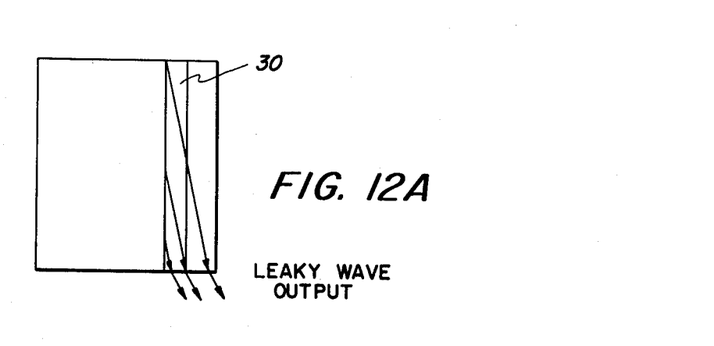
FIGS. 12A and 12B depict top and end views of a laser with leakage provided through a layer perpendicular to the laser active region.
Figure 12B:
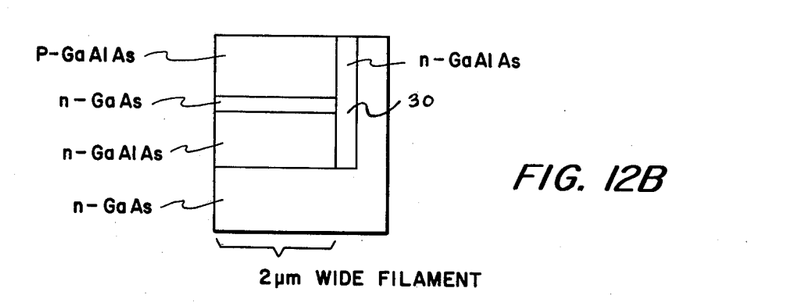

In all of the lasers in accordance with the invention described so far the layer which provided leaky wave coupling was parallel to the laser active region. Since lasers propagate in one direction there are two sides on which to place the thin layer that provides leaky wave coupling. In the laser of FIGS. 12A and 12B, where FIGS. 12a and 12b are top and end views respectively, the thin layer 30 is perpendicular to the plane 12 of the laser rectifying junction rather than parallel to that junction to provide leaky wave output through layer 30. The structure of FIGS. 12A and 12B is applicable to buried heterojunction lasers.

Figure 13:
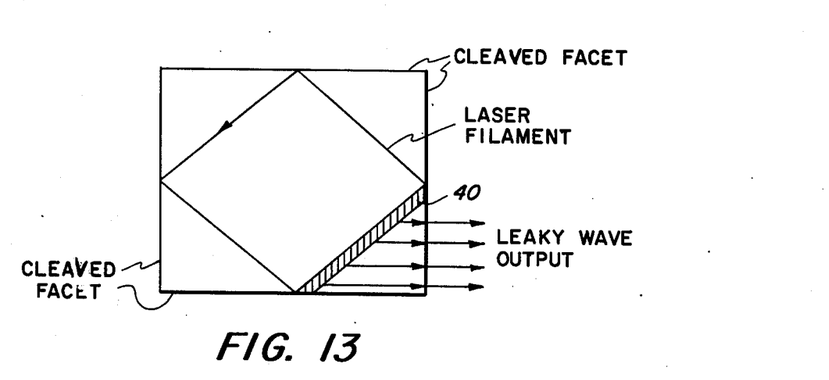
FIG. 13 depicts a top view of a leaky wave ring laser.

FIG. 13 illustrates utilization of leaky wave output in a ring laser. The light leaking layer 40 is perpendicular to the plane of the laser rectifying junction. The beam travelling in the active region layer is totally internally reflected by the cleaved faces but the leaky wave (whose angle of emission can be adjusted by variation of the refractive indicies) can be made to strike the cleaves at a near normal angle (as shown) so that the leaky wave output is not totally reflected. Since the beam in the active region experiences total reflection, the threshold of the laser of FIG. 13 is relatively low even though there is leaky wave output.

What is claimed is:

1. An electrically pumped heterojunction diode laser comprising:

a solid state body including a plurality of contiguous layers, one of said layers being an active region layer formed of a semiconductor material, a carrier confinement layer on at least one side of said active region layer, said confinement layer being of a semiconductor material having an index of refraction lower than the index of refraction of the semiconductor material of said active region layer, an additional layer of semiconductor material on the side of said confinement layer remote from said active region layer, the material of said additional layer having a higher refractive index than the material of said confinement layer, said additional layer being substantially thicker than both said confinement layer and said active region layer, a rectifying junction within said semiconductor body adjacent said active region layer, means for biasing said rectifying junction to provide for carrier injection across said rectifying junction with carrier recombination in said active region layer providing for the generation of radiation of a given wavelength and mode pattern, said confinement layer being sufficiently thin so that a portion of said mode pattern of said generated radiation extends into said additional layer to provide an unguided leaky wave in said additional layer, said leaky wave making an angle to said rectifying junction and being emitted from said body at an angle to said rectifying junction, and the absorption coefficient of said additional layer being such that said leaky wave portion of said mode pattern is not attenuated substantially by said additional layer.

2. The laser of claim 1 wherein said confinement layer is between 0.5 and 0.06 microns thick.

3. The laser of claim 1 wherein said confinement layer is between 0.5 and 0.06 microns thick and said active region layer is between 0.1 and 2.0 microns thick.

4. The laser of claim 1 wherein a very thin confinement layer is provided on two sides of said active region layer, each of said confinement layers being of a semiconductor material having a lower refractive index than the refractive index of the material of said active region layer, and each of said confinement layers being between 0.5 and 0.06 microns thick.

5. The laser of claim 1 wherein highly light reflective coatings are provided at the edges of said active region layer.

6. The laser of claim 1 wherein a highly light reflective coating is applied to one edge of said body and an anti-light reflecting coating is applied to another edge of said body such that said portion of said mode pattern exits said body through said anti-light reflecting coating.

7. The laser of claim 6 wherein said anti-light reflection coating has a thickness which is an odd integer multiple of a quarter wavelength of said leaky portion of said mode pattern.

8. An electrically pumped heterojunction diode laser comprising:
a solid state body including a plurality of contiguous layers,
one of said layers being and active region layer formed of a semiconductor material,
a carrier confinement layer on at least one side of said active region layer, said confinement layer being of a semiconductor material having an index of refraction lower than the index of refraction of the semiconductor material of said active region layer whereby a heterojunction is provided within said body,
an additional layer of semiconductor material on the side of said confinement layer remote from said active region layer, the material of said additional layer having a higher refractive index than the material of said confinement layer, said additional layer being substantially thicker than both said confinement layer and said active region layer,
a rectifying junction within said semiconductor body, and
means for biasing said rectifying junction to provide for carrier injection across said rectifying junction with carrier recombination in said active region layer providing for the generation of radiation of a given wavelength and mode pattern,
said confinement layer being sufficiently thin so that a portion of said mode pattern of said generated radiation extends into said additional layer to provide an unguided leaky wave in said additional layer, said leaky wave making an angle to said heterojunction and being emitted from said body at an angle to said heterojunction,
the absorption coefficient of said additional layer being such that said leaky wave portion of said mode pattern is not attenuated substantially by said additional layer.

9. An electrically pumped heterojunction diode laser comprising:
a solid state body including a plurality of contiguous layers,
one of said layers being an active region layer formed of a semiconductor material,
a carrier confinement layer on at least one side of said active region layer, said confinement layer being of a semiconductor material having an index of refraction lower than the index of refraction of the semiconductor material of said active region layer whereby a heterojunction is provided within said body,
an additional layer of semiconductor material on the side of said confinement layer remote from said active region layer, the material of said additional layer having a higher refractive index than the material of said confinement layer, at least a portion of said confinement layer being substantially thinner than said additional layer.
a rectifying junction within said semiconductor body, and
means for biasing said rectifying junction to provide for carrier injection across said rectifying junction with carrier recombination in said active region layer providing for the generation of radiation of a given wavelength and mode pattern,
said portion of said confinement layer being sufficiently thin so that a portion of said mode pattern of said generated radiation extends into said additional layer to provide an unguided leaky wave in said additional layer, said leaky wave making an angle to said heterojunction and being emitted from said body at an angle to said heterojunction,
the absorption coefficient of said additional layer being such that said leaky wave portion of said mode pattern is not attenuated substantially by said additional layer.

* * * * *